United States Patent [19]

Gates, Jr. et al.

[11] Patent Number: 4,705,917
[45] Date of Patent: Nov. 10, 1987

[54] MICROELECTRONIC PACKAGE

[75] Inventors: Louis E. Gates, Jr., Westlake Village; Albert Kamensky, Redondo Beach; Don C. Devendorf, Los Angeles, all of Calif.

[73] Assignee: Hughes Aircraft Company, Los Angeles, Calif.

[21] Appl. No.: 770,038

[22] Filed: Aug. 27, 1985

[51] Int. Cl.$^4$ .......................................... H01L 23/02
[52] U.S. Cl. ................................ 174/52 FP; 357/74; 361/401; 361/414
[58] Field of Search ............... 174/52 FP; 357/74, 81; 361/401, 414

[56] References Cited

U.S. PATENT DOCUMENTS

| | | | |
|---|---|---|---|
| 3,753,054 | 8/1973 | Johnson | 357/74 |
| 4,288,841 | 9/1981 | Gogal | 174/52 FP X |
| 4,322,778 | 3/1982 | Barbour et al. | 361/414 |
| 4,513,355 | 4/1985 | Schroeder et al. | 174/52 FP X |
| 4,551,746 | 11/1985 | Gilbert et al. | 357/81 X |

FOREIGN PATENT DOCUMENTS 0006810  1/1980  European Pat. Off. .
60-10647  1/1985  Japan .

Primary Examiner—Arthur T. Grimley
Assistant Examiner—David A. Tone
Attorney, Agent, or Firm—L. A. Alkov; A. W. Karambelas

[57] ABSTRACT

A microelectronic package for the protection, housing, cooling and interconnection of a microelectronic chip. The package is made of a plurality of ceramic layers, each of which carries a particular electrically conductive pattern and which have interior openings therein so as to provide recesses in which the chip and discrete capacitors can be located and connected.

22 Claims, 3 Drawing Figures

MICROELECTRONIC PACKAGE

BACKGROUND

This invention is directed to a microelectronic package for the protection, housing, cooling and interconnecting of a microelectronic chip. The package is made of a plurality of ceramic layers each of which carries a particular electrically conductive pattern and which have interior openings therein so as to provide recesses in which the chip and discrete capacitors can be located and connected. The package may include locations for discrete components such as resistors and capacitors. In a computer and similar circuits, the actual processing of information is done entirely by the circuitry on the microelectronic chips, and this would lead one to believe that the functions of packaging are simply to protect the chips, interconnect them with other devices, and to distribute electric power. From this view, the nature of the packaging would not appear to have much influence on the function of the machine. However, in many high-speed data processing units, packaging technology is an important factor which determines or limits performance, cost and reliability. One reason packaging has become so important is the imperative to make the central elementary computing system exceedingly compact. Improvements in the design and fabrication of microelectronic devices have greatly increased the number of logic functions that can be placed on a single chip as well as the speed at which logic functions are performed. As a result, a major source of delay in the central processing unit of many computers is the time required for a signal to pass between chips. In order to reduce this delay, the chips must be placed close together. Putting many chips into a small volume challenges packaging technology in several ways. There is little space available for the many conductors required to distribute power and information bearing signals on the chips. In addition, the properties of this network of conductors must be such as to minimize the distortion of signals. Furthermore, such a dense array of chips gives off sufficient heat that cooling is an important consideration. Signal delays occur because of finite line length of lines interconnecting chips as well as within capacitive, resistive or inductive circuit discrete devices which are connected into a portion of the circuit. Signal delays are increased when such interconnections are made outside of the package. Extended leads of this nature reduce circuit response time. Another important feature of a package into which a circuit chip is to be inserted is the interconnection between the chip and the package. It must be convenient within the package so that accurate interconnection can be made. Furthermore, the connections on the exterior of the package must also be located in such a manner that the package can be appropriately interconnected into the remainder of the circuit. Accordingly, there is need for a microelectronic package which satisfies the diverse requirements of the electronic system in which its contained chip will be employed.

SUMMARY

In order to aid in the understanding of this invention, it can be stated in essentially summary form that it is directed to a microelectronic package formed of a plurality of layers of ceramic, with some of the layers having openings in the interior thereof to form recesses within the package. Some of the layers carry circuitry thereon in such a manner as to form a shelf along one or more edges of the recess for ease of interconnection. The recesses incorporate positions in which discrete components can be located and connected into the circuitry. As required, vias extend through ceramic layers to interconnect circuitry on different ceramic layers.

It is, thus, a purpose and advantage of this invention to provide a microelectronic package into which a semiconductor chip can be secured for thermal control and physical protection, and connected to conductors in the package which may externally connect or connect through vias to other circuitry in the package so that a microelectronic chip can be connected and protected.

It is another purpose and advantage of this invention to provide a microelectronic package which is made of a plurality of layers of ceramic with at least some of the layers carrying conductors thereon opening therein to define one or more recesses in which a microelectronic chip and discrete devices can be located.

It is a further purpose and advantage of this invention to provide a microelectronic package which provides the necessary connectors for distribution of signals and power to and from a microelectronic chip, with the properties of the network being such as to minimize distortion of the signals and wherein the package permits removal of heat from the chip and package so that the package is suitable for high reliability and high performance circuitry.

Other purposes and advantages of this invention will become apparent from a study of the following portion of this specification, the claims and the attached drawings.

DESCRIPTION OF THE PREFERRED EMBODIMENT

Figure 1:
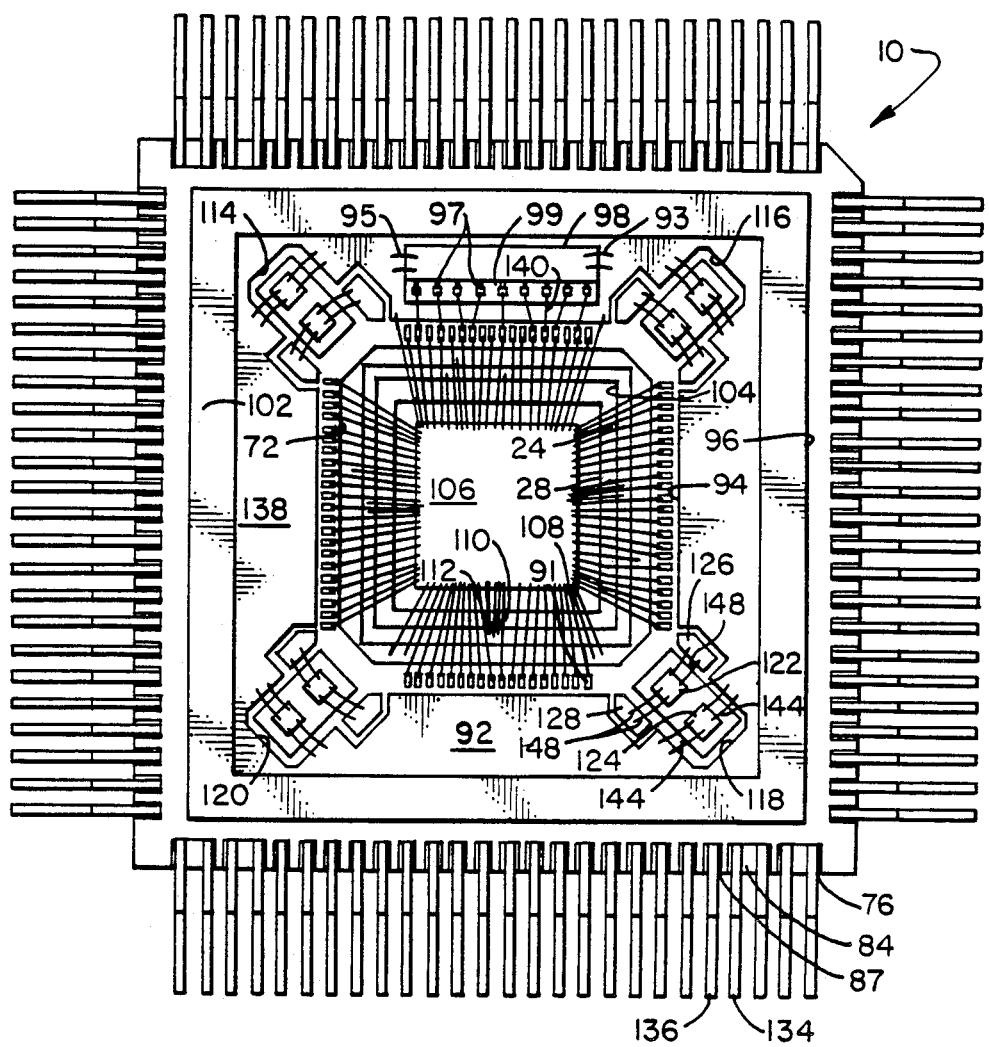
FIG. 1 is a plan view of the microelectronic package in accordance with this invention, with the cover removed and with a circuit chip, decoupling capacitors and resistor networks in place therein.
Figure 2:
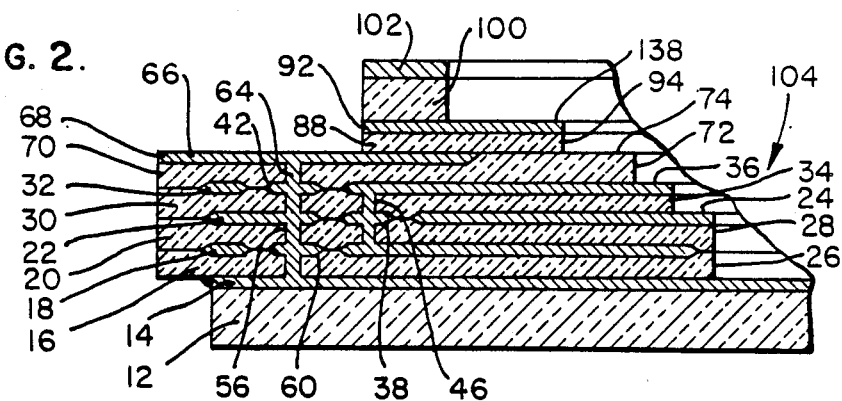
FIG. 2 is an enlarged section through the package, with parts broken away.
Figure 3:
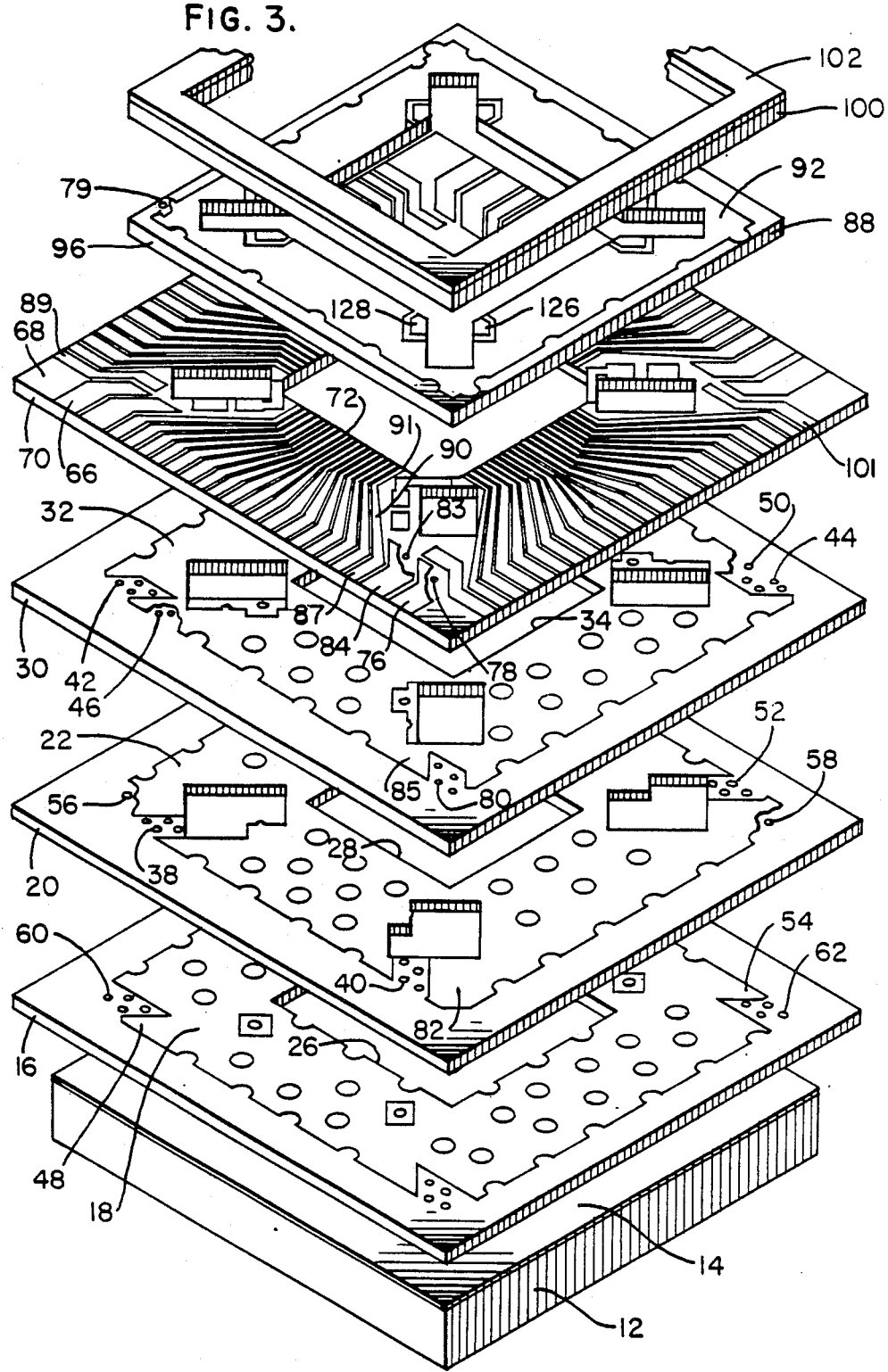
FIG. 3 is an exploded isometric view of the package, showing an example of the circuitry as provided on various layers of the package.

FIG. 1 illustrates the microelectronic package 10 of this invention in plan view, while FIG. 3 illustrates it in vertically exploded form as an isometric view from a corner. Microelectronic package 10 is made up of a plurality of layers, seen in detail in FIG. 2, which are individually produced, stacked, and then fused and brazed together to complete the package. Since the package is manufactured in such a manner, it is appropriate to describe the character of the various layers so that their structure and function in the completed package can be understood. The bottommost structural layer is base 12. Base 12 is preferably square or rectangular, with a square base being shown. Base 12 is preferably of ceramic material and is sufficiently thick to provide added strength but more importantly, thermal heat spreading and thermal conductivity to the package. In the present case, the base layer is preferably made of beryllium oxide. Printed onto the top of base 12, shown in FIG. 2 in exploded position, is base plane 14, which in the preferred embodiment is voltage distribution plane 14. Voltage distribution plane 14 is an electrically conductive plane screen-printed onto the base in a generally all-over pattern. The printed material is a metal film such as tungsten which fuses to the surface when properly sintered so that it is integrally bonded to the ceramic. The several layers are produced in a similar way. The principal purpose of the voltage distribution plane is to provide a satisfactory supply of electric current to the microelectronic chip positioned thereon within the package 10 as well as to maintain the base of the chip at that voltage potential.

Ceramic layer 16 is preferably of the same outline as base 12, but is larger in base dimensions. Ground distribution plane 18 is printed of to the ceramic insulator layer 16. This supplemental ground plane 18 serves to provide more conductive pathways for electric current to flow within the package, thus lowering the net internal resistance of the ground current pathways. Voltage plane 22 is printed onto layer 20. Since voltage is required to operate circuits of the chip, it is convenient to provide a substantially continuous circuit voltage plane 22 on voltage plate 20 for the purpose of permitting connection between its ledge 24 and the microelectronic chip to the various circuitry on the chip which require voltage. It is important to note that there is an interior opening in each of ceramic layers 16 and 20. The openings are rectangular or square openings defined by interior edges 26 and 28. It is through this opening, down to the voltage plane 14 on base 12 that the microelectronic chip will be mounted.

Ceramic layer 30 is of similar external dimensions as layers 16 and 20, but has a larger interior opening defined by edge 34 to provide an interior ledge 36. Ground plane 32 is printed onto layer 30 and is patterned to achieve the desired connections. Ground plane 32 is for providing easy connection between the ledge 36 and the microelectronic chip to the various circuitry on the chip which require a common ground.

There are two ways of connecting between the circuit planes on the several stacked insulating ceramic layers. Vias are holes through the ceramic layers filled with essentially the same conductive metal material forced through the holes, as is selectively printed as a plane on the top of each ceramic layer. The vias are very small in diameter. There may be alignment problems between layers if the vias are to line up in successive layers. It is for this reason that via catch pads such as 38, 40, 42 and 44 are provided. They are of larger diameter then the vias and permit easier alignment. For example, vias 46 under the left corner of ground plane 32 and through layer 30 are in contact with the ground plane 32. They are in alignment with via catch pads 38 which cover vias through layer 20. Those vias contact the corner 48 of ground plane 18 to provide electrical contact between the two ground planes 18 and 32. There are four vias at each location for redundacy and current spreading, and there are four vias in each corner which perform the same function for current distribution through the planes. For example, there are four vias 50, only one of which is shown by breakaway of a portion of the ground plane 32 at the right corner thereof. These vias 50 extend through the layer 30 and are in engagement with via catch pads 52. Via catch pads 52 cover vias through layer 20 and at their lower ends, those vias are in contact with the corner 54 of ground plane 18.

In similar manner, voltage plane 22 is in electrical communication with voltage distribution plane 14 by means of vias 56 and 58, under the corners of voltage plane 22 and shown in FIG. 3 by a breakaway of the corners. These vias are in electrical contact with voltage plane 22 and extend downward through layer 20. They are respectively in contact with via catch pads 60 and 62 which cover vias through layer 16. The lower ends of those vias are in contact with voltage distribution plane 14 in order to provide electrical contact between plane 22 and plane 14. Other vias and their connections and functions will be described below.

In considering the vias, it is necessary to understand the process steps and manufacture of the completed package 10, and the changes effected by each of the steps. Each of the layers (above base layer 12) is 0.010 inch thick in vitrified ceramic. It is selectively coated with metal paste which is forced through the via holes in the ceramic. Thus, there is a coating of metal paste above each via, and the coating may be a catch pad, a connection pad, or a distribution plane. When the layers are completed, they are assembled and fused. It is noted that the edges of the layers 16, 20 and 30 are not coated with metal, and, thus, the ceramic edges fuse together as shown in the left of FIG. 2. Similarly, the ceramic fuses together around the catch pads, as for example around catch pad 38 in FIG. 2. The via 46 joins and is fused with the catch pad 38, and the via below the catch pad is fused therewith and with ground plane 18.

FIG. 2 also shows via 64 under pad 66 which is one of the pads on connection plane or signal plane 68 on signal layer 70. Via 64 is formed with pad 66, and via 64 is in contact with catch pad 42 which, in turn, is formed with the via thereunder through ground layer 30. Voltage plane 22 has via 56 thereunder, and the via 56 is in contact with catch pad 60 which, in turn, has a via thereunder which joins voltage plane 14. In this way, voltage pad 66 supplies voltage to voltage planes 22 and 14 while bypassing ground planes 32 and 18. These vias are provided as an example. Additional vias are provided for other functions, for redundancy, and for current spreading.

Layer 70 is the next layer in the stack. Layer 70 has the same external size as layers 16, 20 and 30. It has an internal opening 72 which is slightly larger than opening 34 to leave a ledge 36. Printed upon layer 70 is signal plane 68 which is of different character than the generally similar configurations of the other planes. Signal plane 68 is configured to provide connection circuitry between internal pads within the package to external pads to which a lead frame can be attached. As is seen in FIG. 1, there are eighty signal connection pads and also in FIG. 1 there are eighty corresponding external signal leads connected thereto. As is seen in FIG. 3, the external lead connection pads are connected through to internal chip connection pads where the layer 70 has an internal opening 72 therein with the internal connection pads going to the edge of that opening to be exposed on ledge 36. The external connection pads extend to the outer peripheral edge of signal plane 68. While there are too many connection pads to be individually identified, it can be seen that the near corner connection pad 76, as seen in FIG. 3, is connected through vias 78, via catch pad 80 and vias therebeneath to the corner 82 of voltage plane 22, in parallel to pad 66. A set of four vias is provided in each corner pad for redundancy, as described. The next connection pad is ground connection pad 84 which is connected through vias 83 to the ground plane 32 at its corner 85. The next connection pad 87 is connected through printed circuit lead 90 to interior connection pad 91. There are seventy-nine additional leads connected to their respective connection pads similar to connection pad 87 that is connected through its printed circuit lead to interior connection pads similar to pad 91. As illustrated in FIG. 1, there are one hundred lead frame connections around the package 10, and while some of them are redundant for voltage and ground distribution purposes, it can be seen that there are eighty independent connections between the external connection pads and the internal connection pads. Preferably, the connection pads are arranged around all four sides of the package 10, as indicated in FIG. 1.

The openings in the center of the plates and planes are stepped back so the interior edges of the planes are successively exposed. This is shown at the right of FIG. 2 where the ledges permit connection between each plane to the microelectronic chip.

Ceramic layer 88 is smaller in the external dimension than the layers 16, 20, 30 and 70. Layer 88 rests on layer 70. This layer has printed on it another voltage plane 92 which is used to provide voltage for one or more special resistor networks mounted thereon. Resistor network 98 is shown in FIG. 1. The upper side of this network is connected to voltage plane 92 by means of wirebonds 93 and 95. The resistance network has a plurality of connection pads 97 thereon. These connection pads 97 each connect to individual resistors between the pads and voltage plane 92 through voltage bus 99. In the present case, voltage plane 92 is of a different voltage than voltage planes 14 and 22. Voltage plane 92 is supplied by vias 79 extending from connection pads 89 on connection plane 68 upward through layer 88. While only one resistor network 98 is shown in FIG. 1, it is clear that such a resistor network can be mounted on each of the four shelves defined by voltage plane 92 around the interior opening in the package. Layer 88 also has an interior opening defined by interior edge 94 to expose the connection ledge 74. Layer 88 is defined by exterior edge 96 which is smaller than the layers below to expose the exterior connection pads on plane 68. Layer 88 has such vias as are required to connect it to the required voltage pads such as voltage pad 101 shown in FIG. 3. The external edge 96 defines the size of layer 88 to be smaller than the exterior edges of the lower layers so as to leave an exposed exterior shelf, see FIGS. 1 and 2, along which the exterior pad connections are exposed. Similarly, the interior edge 94 defines the opening which is larger than the openings in layers 16, 20, 30 and 70 so as to leave an interior ledge 74 along which the interior connection pads are exposed. Finally, cover ring 100 is mounted on the top of layer 88. The cover ring 100 has the same outside dimensions as the layer 88, so the external pads remain accessible. On top of the cover ring is a metallic seal ring 102 upon which a cover may be sealed. Kovar is a suitable material for the metallic seal ring 102.

After these layers have their conductive planes formed thereon, the layers are stacked and fused. Thereupon, the entire structure is plated with nickel which deposits upon the exposed conductors. The top of base 12 has also been plated with nickel. Thereupon, the base 12 is assembled under the previously fused ceramic stack and the base is brazed to the stack. Voltage distribution plane 14 and its nickel plating forms a fillet underneath layer 16, around the edges thereof where the base 12 is smaller than the layer 16. This smaller size is provided so that the fillet can form and be inspected for thorough brazing. The exposed nickel surface provides a wettable surface for attachment. The package 10 is thereupon in condition for installation of the chip.

The interior recess 104 defined by the interior openings in ground layer 16, voltage layer 20, ground layer 30, connection layer 70, supplemental voltage layer 88 and cover ring 100 permit the installation of a microelectronic chip 106 directly down upon the voltage plane 14 on base 12. Such a mounting serves to aid in conduction of heat away from the chip, with a careful and thorough thermal connection to the voltage plane 14. The contact points around the periphery of the chip 106 are connected by fine wires to the interior connection pads by means of any convenient method such as ultrasonic wedge or ball bonding. Connection wire 108 is illustrated in FIG. 1, as is a plurality of other connections from the chip to other interior connection pads.

As is seen in FIG. 1, the opening 72 on the interior of connection layer 70 and connection plane 68 is larger than the opening defined by edge 34 in layer 30 and ground plane 32. As previously described, this exposes an interior shelflike ledge 36, see FIG. 2, of the ground plane to which the circuit wires from the chip can be directly connected. For example, connection wire 110 makes this direct connection. Furthermore, the opening defined by edge 34 in layer 30 in ground plane 32 is larger than the opening 28 to expose the inner ledge 24 of the voltage plane to which the appropriate connection wires from the chip 106 can be directly connected. Connection wire 112 is an example of such connection. In this way, the many connections to ground and voltage can be made with very short connections without requiring circuitry to go externally from the package.

Another important part of the structure of the microelectronic package is represented by the cavities or recesses 114, 116, 118 and 120 around the main cavity 104 in the bottom of which is secured microelectronic chip 106. The recesses 114 through 120 are, in this preferred embodiment, positioned at the corners of the main cavity. The sides of the recesses 114 through 120 extend straight down from the surface of supplemental voltage plane 90 to ground plane 18. The capacitors 122 and 124 rest on and are electrically connected to the ground plane 18.

The recesses are sized to each receive two discrete capacitors so that they permit the components to be directly and closely connected to the related voltage circuitry in the package. Illustrated as being positioned within these recesses are two capacitors in each such recess. Capacitors 122 and 124 are shown in recess 118. Pads are positioned adjacent the capacitors on the layer 88 isolated from supplemental voltage plane 92 with pads 126 and 128 located adjacent the capacitors 124 and 122.

These pads are on supplemental voltage layer 88 but are isolated from supplemental voltage plane 92. Wire bonds 148 are used to connect capacitor 122 to pads 126 and 128. These pads are voltage pads with vias down through to voltage plane 22. Capacitor 124 is connected by wire bonds 144 to supplemental voltage plane 92. The capacitors are metalized on top and bottom. Bottoms sit on ground plane 18 and are affixed and connected thereto with conductive adhesive. Top electrodes of each capacitor are connected to respective planes through aforementioned wire bonds, each voltage plane having a capacitor connection at each corner. Thus, decoupling between the ground planes 18 and 32 and the supplemental voltage plane 92 is accomplished through one capacitor and between voltage planes 14 and 22 with the other capacitor. This is repeated by the use of two capacitors at each of the three other corners of the package.

The individual ceramic layers on the upper layered structure are made by mixing the selected ceramic materials (aluminum oxide and minor oxide additives known in the art) with a binder and solvent. The mixture is milled and cast to uniform thickness and dried, driving out the solvent. The result is a sheet of material that is sufficiently structurally sound for handling. The individual layer elements are stamped out, including punching of the vias and other lateral features. On each layer a conductive paste is placed thereon in the desired pattern, such as by screening, and the paste is forced through the vias. The stack is assembled and laminated under moderate pressure, and is carefully heated to sintering temperature by techniques well known in the art. The binder is driven off, while the alumina and metal are fused into a monolithic ceramic structure. The structure is now unitary and the circuitry therein can again be tested for continuity and short circuits before further work.

The beryllium oxide base 12 is made by a different process which is known in the art as a dry or powder pressing. The almost pure beryllium oxide powder is mixed with a binder and is pressed in a die at a very high pressure to make a dense block. This block is then carefully sintered to drive off the binder and fuse the beryllium oxide into a hard ceramic structure or layer. This ceramic layer is then screen-printed with metal paste and sintered again to fuse the metal to the ceramic by methods well known in the art. The metal-coated beryllium oxide base is then nickel-plated and brazed to the underside of the alumina structure to make a complete package, which is the object of this invention. Instead of a ceramic base, a metal base can be used.

The package 10 is usually incorporated into other circuitry which is provided as a main board with printed circuitry on a printed wiring board as is well known in the art. In order to provide the connections from the pads 66, 76, 84, 87, 89, 98 and the other pads around the periphery of the main board, flexible metal leads are provided on the package 10. These leads are constructed on a comblike lead frame. The leads on the lead frame are secured by brazing to the pads on package 10. Thereupon, the connecting lead frame is cut apart from the leads so that the individual leads shown in FIG. 1 are achieved. Leads 134 are secured to double size pad 84, while lead 136 is secured to an adjacent single pad 87. Further leads are secured to the remaining pads around the main structure of package 10. When it is completed, the package 10 is placed in its appropriate location on the printed wiring board and the leads 134, 136 et seq are reflow soldered onto the circuitry of the printed wiring board. The attachment of the lead frames to the package 10 is accomplished before the installation of microelectronic chip 106 and the related discrete components such as resistor network 98 and capacitors 122 and 124.

As previously described, one or more resistor networks 98 can be placed on the shelf 138 on the top of voltage plane 92 and interiorly of cover ring 102. The resistor network 92 has one side of each resistor connected to the voltage plane 92 and the other side of each resistor is selectively connected to various pads. For example, wire 140, see FIG. 1, connects one of the pads on resistor network 98 to one of the interiorly exposed connecting pads on the signal plane 68. More resistor networks can be provided and wire can be provided to connect individual resistors on an appropriately located network to desired signal leads. After securement of the chip and discrete components in place within the package, they are electrically connected to the appropriate pads and planes, as required by the circuit. A plurality of connecting wires 24, 108, 110, and 148 is shown. In this way, a microelectronic package having very short and convenient connections to the chip is achieved.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A microelectronic package comprising:
    a plurality of metal planes, said plurality of metal planes comprising at least a voltage plane, a ground plane, a base plane and a signal plane, interior openings in said voltage plane, said ground plane and said signal plane defining a microelectronic chip cavity;
    said voltage plane, said ground plane and said signal plane each defining electric circuitry;
    said voltage plane, said ground plane and said signal plane being stacked on said base plane so that said planes are positioned as a lower plane against said base plane, an intermediate plane against and above said lower plane, an upper plane against and above said intermediate plane;
    said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane;
    a second voltage plane mounted on top of said signal plane, said second voltage plane having exterior edges which are closer together than the exterior edges of said upper plane so that an exterior ledge carrying circuitry on said upper plane is exposed at the exterior of said package for external connection.

2. The microelectronic package of claim 1 wherein said signal plane is the upper plane of said signal plane, said ground plane and said voltage plane, and said plane on top of said signal plane is said secondary voltage plane.

3. The microelectronic package of claim 2 wherein circuitry on said signal plane comprises a plurality of pads on the exterior ledge thereof and a plurality of pads on the interior ledge thereof, said interior and said exterior pads being interconnected by conductors on the surface of said signal plane.

4. The microelectronic package of claim 3 where in addition to said openings defining a microelectronic chip cavity within said package, walls in at least some of said planes define a discrete device cavity for receiving a discrete electronic device for connection to circuitry in said microelectronic package.

5. A microelectronic package comprising:
a plurality of metal planes, said plurality of metal planes comprising at least a voltage plane, a ground plane, a base plane and a signal plane, interior openings in said voltage plane, said ground plane and said signal plane defining a microelectronic chip cavity;
said voltage plane, said ground plane and said signal plane each defining electric circuitry;
said voltage plane, said ground plane and said signal plane being stacked on said base plane so that said planes are positioned as a lower plane against said base plane, an intermediate plane against and above said lower plane, an upper plane against and above said intermediate plane;
said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane; where in addition to said openings defining a microelectronic chip cavity within said package, walls in at least some of said planes define a discrete device cavity for receiving a discrete electronic device for connection to circuitry in said microelectronic package.

6. The microelectronic package of claim 5 wherein said discrete device cavity is in communication with one or more said conductors on said signal plane.

7. The microelectronic package of claim 6 wherein there is a plurality of discrete device cavities adjacent to said microelectronic chip cavity.

8. A microelectronic package comprising:
a plurality of metal planes, said plurality of metal planes comprising at least a voltage plane, a ground plane, a base plane and a signal plane, interior openings in said voltage plane, said ground plane and said signal plane defining a microelectronic chip cavity;
said voltage plane, said ground plane and said signal plane each defining electric circuitry;
said voltage plane, said ground plane and said signal plane being stacked on said base plane so that said planes are positioned as a lower plane against said base plane, an intermediate plane against and above said lower plane, an upper plane against and above said intermediate plane;
said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane;
a second voltage plane mounted on top of said signal plane, said second voltage plane having exterior edges which are closer together than the exterior edges of said upper plane so that an exterior ledge carrying circuitry on said upper plane is exposed at the exterior of said package for external connection; wherein said base plane is under said lower plane, said base plane is comprised of a metal coating on a dielectric base substrate, and said dielectric base substrate is a highly thermally conductive ceramic.

9. The microelectronic package of claim 8 wherein said highly thermally conductive ceramic is beryllium oxide.

10. The microelectronic package of claim 8 wherein said metal base plane on said dielectric substrate is brazed to said plurality of ground, voltage and connection planes.

11. A microelectronic package comprising:
a plurality of metal planes, said plurality of metal planes comprising at least a voltage plane, a ground plane, a base plane and signal plane, said voltage plane, said ground plane and said signal plane each being a substantially planar coating on a dielectric substrate, said base plane being made of solid metal, interior openings in said voltage plane, said ground plane and said signal plane defining a microelectronic chip cavity;
said voltage plane, said ground plane and said signal plane each defining electric circuitry;
said voltage plane, said ground plane and said signal plane being stacked on said base plane so that said planes are positioned as a lower plane against said base plane, an intermediate plane against and above said lower plane, an upper plane against and above said intermediate plane;
said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane;
a second voltage plane mounted on top of said signal plane, said second voltage plane having exterior edges which are closer together than the exterior edges of said upper plane so that an exterior ledge carrying circuitry on said upper plane is exposed at the exterior of said package for external connection.

12. The microelectronic package of claim 11 wherein said solid metal base plane closely matches the thermal expansion of said plurality of ground, voltage and connection planes on said substrates.

13. The microelectronic package of claim 11 wherein said metal base plane is brazed to said plurality of ground, voltage and connection planes on said substrates.

14. A microelectronic package comprising:
a plurality of metal planes, said plurality of metal planes comprising at least a voltage plane, a ground plane, a base plane and a signal plane, said voltage plane, said ground plane, and said signal plane each being a substantially planar coating on a dielectric substrate, interior openings in said voltage plane, said ground plane and said signal plane defining a microelectronic chip cavity;
said voltage plane, said ground plane and said signal plane each defining electric circuitry;
said voltage plane, said ground plane and said signal plane being stacked on said base plane so that said planes are positioned as a lower plane against said base plane, an intermediate plane against and above said lower plane, an upper plane against and above said intermediate plane;
said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane;
a second voltage plane mounted on top of said signal plane, said second voltage plane having exterior edges which are closer together than the exterior edges of said upper plane so that an exterior ledge carrying circuitry on said upper plane is exposed at the exterior of said package for external connection; said dielectric substrate of said voltage plane, ground plane and signal plane being aluminum oxide ceramic.

15. A microelectronic package comprising:
a plurality of metal planes, said plurality of metal planes comprising at least a voltage plane, a ground plane, a base plane and a signal plane, interior openings in said voltage plane, said ground plane and said signal plane defining a microelectronic chip cavity;
said voltage plane, said ground plane and said signal plane each defining electric circuitry;
said voltage plane, said ground plane and said signal plane being stacked on said base plane so that said planes are positioned as a lower plane against said base plane, an intermediate plane against and above said lower plane, an upper plane against and above said intermediate plane;
said openings in said voltage plane, said ground plane and said signal plane being sized so that said opening in said lower plane is smaller than said opening in said intermediate plane and said opening in said intermediate plane is smaller than said opening in said upper plane so that a ledge for connection to circuitry on said intermediate plane is exposed within said opening in said upper plane and a ledge for connection to circuitry on said lower plane is exposed within said opening in said intermediate plane so that when a microelectronic chip is positioned within the microelectronic chip cavity defined by said interior openings, the microelectronic chip can be connected to the conductors on the exposed edges in the interior opening of said signal plane, said ground plane and said voltage plane;
a second voltage plane mounted on top of said signal plane, said second voltage plane having exterior edges which are closer together than the exterior edges of said upper plane so that an exterior ledge carrying circuitry on said upper plane is exposed at the exterior of said package for external connection; said metal comprising said planes being tungsten.

16. A microelectronic package comprising:
a plurality of metal planes, each consisting of coatings on a dielectric substrate, said coatings constituting conductive circuitry deposited on the surface of said dielectric substrate thereof, said coated dielectric substrates being stacked and being fused together so as to form a unitary package, a plurality of said planes having an interior cavity therein for receipt of a microelectronic chip, said planes including a signal plane having a plurality of circuits extending from pads adjacent the exterior edge thereof to pads adjacent the interior edge thereof and an upper plane on top of said signal plane, said upper plane being smaller in its exterior size and larger on its interior size than said signal plane so as to expose exterior pads on a ledge adjacent the exterior edge thereof and interior pads around a ledge adjacent the interior edge thereof for respective connection to exterior circuitry and to a microelectronic chip to be mounted within the interior of said package; and
walls defining a further cavity within said package adjacent said chip cavity, said further cavity being for receipt of a discrete device.

17. The microelectronic package of claim 16 wherein said further cavity is in electrical communication with some of said exterior pads.

18. The microelectronic package of claim 17 wherein there is a plurality of said further cavities around said chip cavity.

19. The microelectronic device of claim 18 wherein there is a lower plane and an intermediate plane below said signal plane, one of said lower and intermediate planes being a ground plane and the other being a voltage plane, each of said ground and said voltage planes comprising an electrical conductor deposited on the upper surface of a dielectric plate, said intermediate plane having a smaller opening than said signal plane so that the electrical conductor thereof is exposed on a ledge and said lower plane having a smaller opening than said intermediate plane so that the electrical conductor thereon is exposed on a ledge.

20. The microelectronic package of claim 19 wherein the exterior edges of said signal plane, said ground plane and said voltage plane are in substantial alignment.

21. The microelectronic package of claim 19 wherein said discrete component recess extends downward through said connection plane, said intermediate plane and said lower plane.

22. The microelectronic package of claim 21 wherein said upper plane is connected to at least one of said exterior pads on said signal plane.

* * * * *